United States Patent
Myung et al.

(10) Patent No.: US 10,541,187 B2
(45) Date of Patent: Jan. 21, 2020

(54) SEMICONDUCTOR PACKAGE INCLUDING ORGANIC INTERPOSER

(71) Applicant: SAMSUNG ELECTRONICS CO., LTD., Suwon-si (KR)

(72) Inventors: Jun Woo Myung, Suwon-si (KR); Akihisa Kuroyanagi, Suwon-si (KR); Yeong A Kim, Suwon-si (KR); Eun Sil Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/950,926

(22) Filed: Apr. 11, 2018

(65) Prior Publication Data
US 2019/0139851 A1    May 9, 2019

(30) Foreign Application Priority Data
Nov. 3, 2017  (KR) .................. 10-2017-0146194

(51) Int. Cl.
*H01L 23/31* (2006.01)
*H01L 23/00* (2006.01)
*H01L 23/29* (2006.01)

(52) U.S. Cl.
CPC ........ *H01L 23/3171* (2013.01); *H01L 23/291* (2013.01); *H01L 23/3135* (2013.01); *H01L 24/48* (2013.01); *H01L 2224/12105* (2013.01); *H01L 2224/451* (2013.01); *H01L 2924/182* (2013.01); *H01L 2924/183* (2013.01); *H01L 2924/3511* (2013.01)

(58) Field of Classification Search
None
See application file for complete search history.

(56) References Cited

U.S. PATENT DOCUMENTS

| 8,796,072 | B2 * | 8/2014 | Kelly | .................. | H01L 23/3128 |
| | | | | | 257/E21.001 |
| 9,490,231 | B2 * | 11/2016 | Ko | ......................... | H01L 23/562 |
| 2004/0163843 | A1 | 8/2004 | Shin et al. | | |

(Continued)

FOREIGN PATENT DOCUMENTS

| JP | 2011-086705 A | 4/2011 |
| JP | 2017-005175 A | 1/2017 |

(Continued)

OTHER PUBLICATIONS

Korean Office Action issued in corresponding Korean Patent Application No. 10-2017-0146194, dated Jul. 27, 2018, with English Translation.

(Continued)

*Primary Examiner* — Chandra Chaudhari
(74) *Attorney, Agent, or Firm* — Sughrue Mion, PLLC

(57) ABSTRACT

A semiconductor package including an organic interposer includes: first and second semiconductor chips each having active surfaces having connection pads disposed thereon; the organic interposer disposed on the active surfaces of the first and second semiconductor chips and including a wiring layer electrically connected to the connection pads; barrier layers disposed onside surfaces of the first and second semiconductor chips; and an encapsulant encapsulating at least portions of the first and second semiconductor chips.

18 Claims, 7 Drawing Sheets

(56) References Cited

U.S. PATENT DOCUMENTS

| | | |
|---|---|---|
| 2011/0084384 A1 | 4/2011 | Sakata et al. |
| 2012/0086109 A1 | 4/2012 | Kim et al. |
| 2012/0193779 A1 | 8/2012 | Lee et al. |
| 2014/0124949 A1 | 5/2014 | Paek et al. |
| 2017/0047294 A1 | 2/2017 | Chang et al. |
| 2017/0117200 A1 | 4/2017 | Kim et al. |
| 2017/0133334 A1 | 5/2017 | Kim et al. |
| 2017/0200686 A1 | 7/2017 | Kang et al. |

FOREIGN PATENT DOCUMENTS

| | | |
|---|---|---|
| KR | 10-2004-0075629 A | 8/2004 |
| KR | 10-2012-0036128 A | 4/2012 |
| KR | 10-2012-0087651 A | 8/2012 |
| KR | 10-2014-0058268 A | 5/2014 |
| KR | 10-2017-0019967 A | 2/2017 |
| KR | 10-2017-0047019 A | 5/2017 |
| KR | 10-2017-0054199 A | 5/2017 |
| KR | 10-1753512 B1 | 6/2017 |

OTHER PUBLICATIONS

Office Action issued in corresponding Korean Application No. 10-2017-0146194, dated Feb. 21, 2019.

Communication dated Jul. 29, 2019, issued by the Korean Intellectual Property Office in corresponding Korean Application No. 10-2017-0146194.

\* cited by examiner

SEMICONDUCTOR PACKAGE INCLUDING ORGANIC INTERPOSER

CROSS-REFERENCE TO RELATED APPLICATION(S)

This application claims the benefit of priority to Korean Patent Application No. 10-2017-0146194, filed on Nov. 3, 2017 in the Korean Intellectual Property Office, the disclosure of which is incorporated herein by reference in its entirety.

BACKGROUND

1. Field

The present disclosure relates to a semiconductor package including an organic interposer.

2. Description of Related Art

In accordance with improvement of specifications of a set and use of a high bandwidth memory (HBM), an interposer market has grown. Currently, silicon has been mainly used as a material of the interposer, but development of glass or organic interposers has been conducted in order to increase an area and reduce a cost.

An interposer package may be manufactured by performing a package process of attaching a die, such as a semiconductor chip, to the interposer, and molding or encapsulating the die. Here, when a molding process is performed, 2.5D package handling is not conducted, such that the interposer package may not be connected to a ball grid array (BGA) substrate, or the like. Therefore, rigidity of the interposer package has been maintained by the molding. However, when the molding process is performed, warpage of the interposer package may occur, and a crack between the die and an encapsulant may occur, due to mismatch between coefficients of thermal expansion (CTEs) of the interposer and the encapsulant of the die.

SUMMARY

An aspect of the present disclosure may provide a semiconductor package including an organic interposer capable of having improved reliability by forming a stress barrier layer between an encapsulant and a semiconductor chip.

According to an aspect of the present disclosure, a semiconductor package including an organic interposer may be provided, in which a barrier layer is formed between an encapsulant and a semiconductor chip.

According to an aspect of the present disclosure, a semiconductor package may include: first and second semiconductor chips each having active surfaces having connection pads disposed thereon; the organic interposer disposed on the active surfaces of the first and second semiconductor chips and including a wiring layer electrically connected to the connection pads; barrier layers disposed on side surfaces of the first and second semiconductor chips; and an encapsulant encapsulating at least portions of the first and second semiconductor chips.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
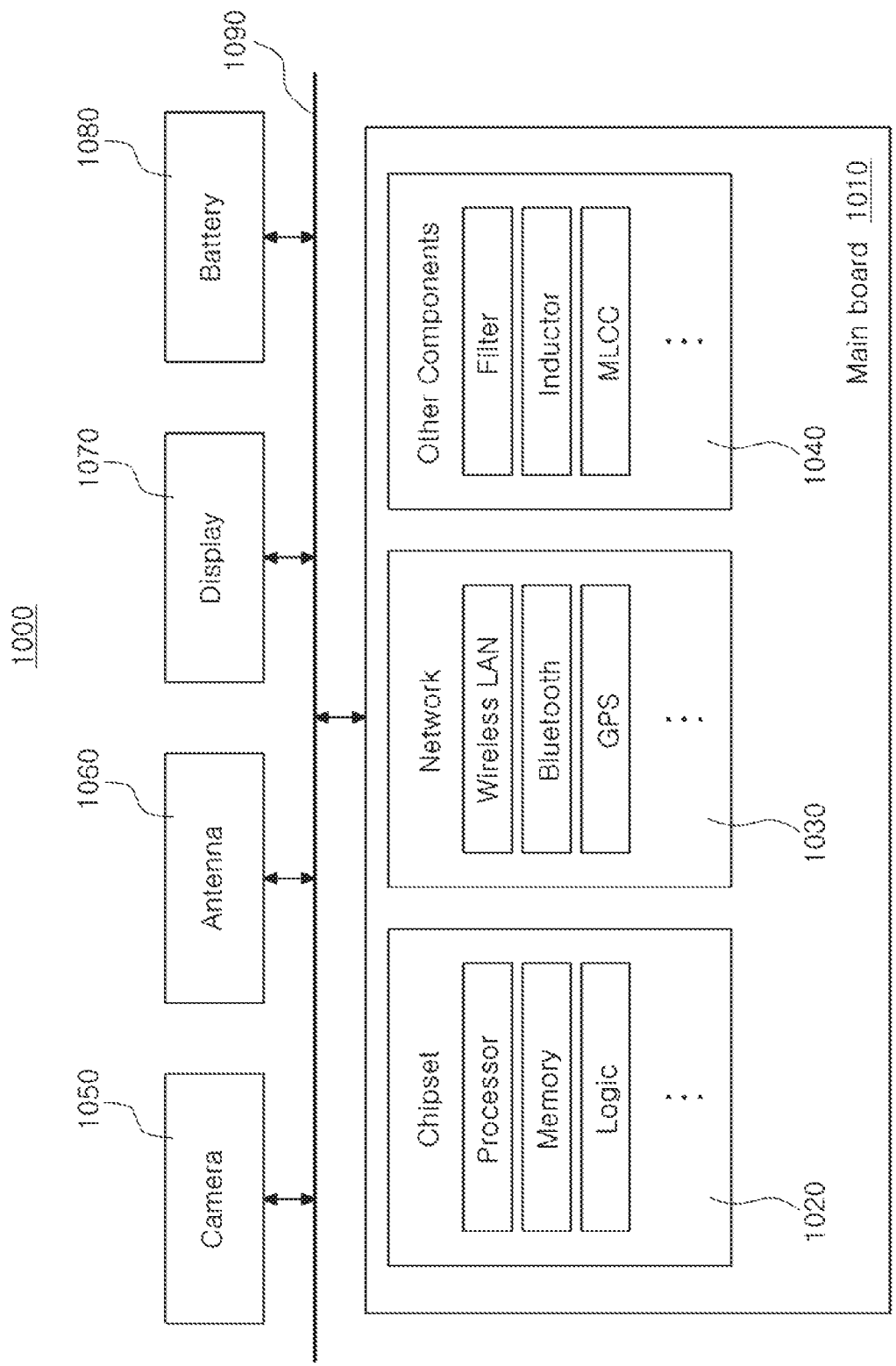
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 maybe combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
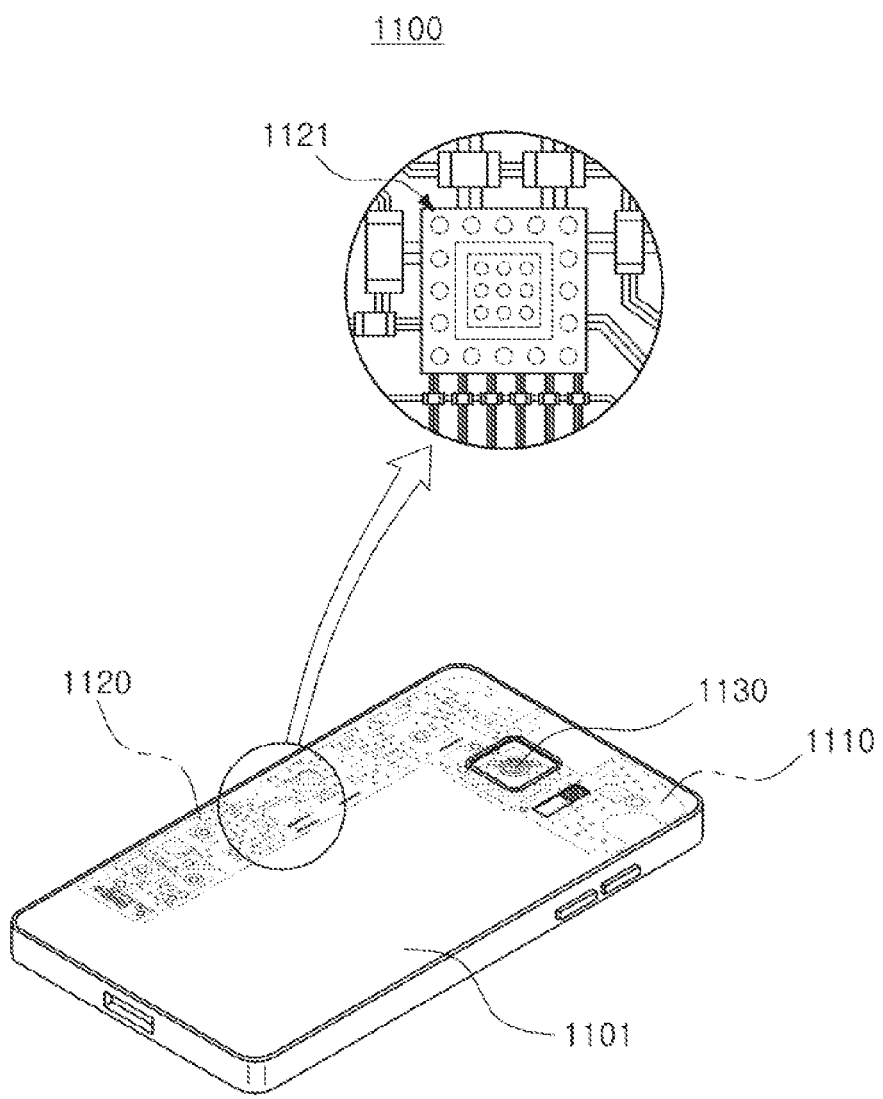
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be chip related components, and some of the chip related components may be an interposer package 1121. The electronic device is not necessarily limited to the smartphone 1100, but may be other electronic devices as described above.

Semiconductor Package Including Organic Interposer

Generally, numerous fine electrical circuits are integrated in a semiconductor chip. However, the semiconductor chip may not serve as a semiconductor finished product in itself because it may be damaged due to external physical or chemical impact. Therefore, the semiconductor chip is generally not used in an exposed form, but rather is packaged and used in an electronic device, or the like, in a package state.

Semiconductor packaging is also used because there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package including an organic interposer manufactured by the packaging technology described above will hereinafter be described in more detail with reference to the drawings.

Figure 3:
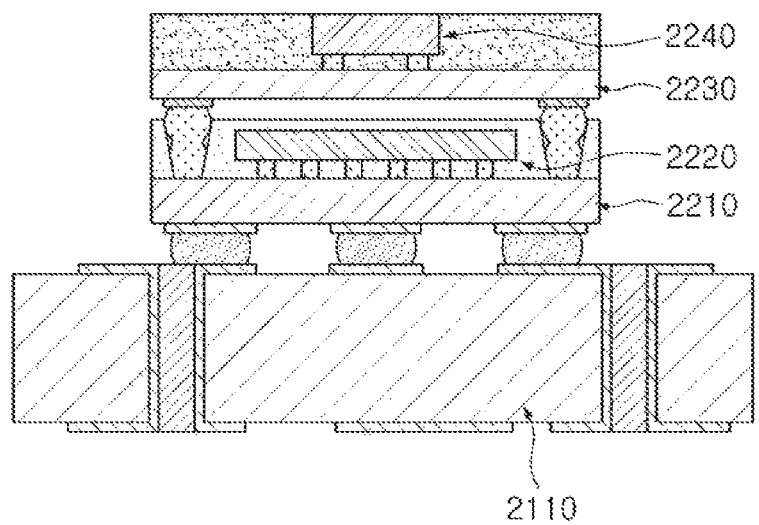
FIG. 3 is a schematic cross-sectional view illustrating a case in which a 3D ball grid array (BGA) package is mounted on a mainboard of an electronic device.

FIG. 3 is a schematic cross-sectional view illustrating a case in which a 3D ball grid array (BGA) package is mounted on a mainboard of an electronic device.

An application specific integrated circuit (ASIC) such as a graphics processing unit (GPU) among semiconductor chips is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted, and the semiconductor chip that is expensive, such as a GPU 2220, or the like, is mounted and packaged on the BGA substrate 2210 by surface mounting technology (SMT), or the like, and is then mounted ultimately on a mainboard 2110.

Meanwhile, in a case of the GPU 2220, it is required to significantly reduce a signal path between the GPU 2220 and a memory such as a high bandwidth memory (HBM). To this end, a product in which a semiconductor chip such as the HBM 2240 is mounted and then packaged on an interposer 2230, and is then stacked on a package in which the GPU 2220 is mounted, in a package-on-package (POP) form is used. However, in this case, a thickness of a device is excessive increased, and there is a limitation in significantly reducing the signal path.

Figure 4:
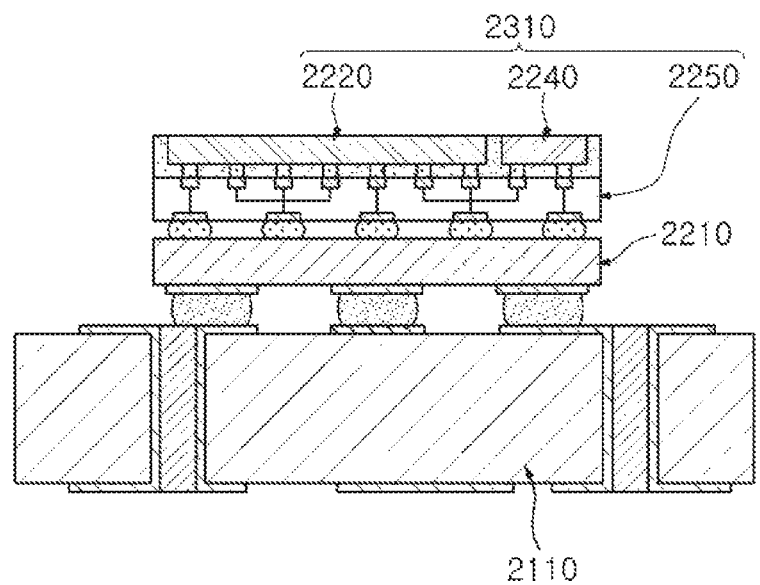
FIG. 4 is a schematic cross-sectional view illustrating a case in which a 2.5D silicon interposer package is mounted on a mainboard.

FIG. 4 is a schematic cross-sectional view illustrating a case in which a 2.5D silicon interposer package is mounted on a mainboard.

As a method for solving the problem described above, it maybe considered to manufacture a semiconductor package 2310 including a silicon interposer by 2.5D interposer technology of surface-mounting and then packaging a first semiconductor chip such as a GPU 2220 and a second semiconductor chip such as an HBM 2240 side-by-side with each other on a silicon interposer 2250. In this case, the GPU 2220 and the HBM 2240 having several thousands to several hundreds of thousands of connection pads may be redistributed by the silicon interposer 2250, and may be electrically connected to each other through the shortest path. In addition, when the semiconductor package 2310 including a silicon interposer is again mounted and redistributed on a BGA substrate 2210, or the like, it may be ultimately mounted on a mainboard 2110. However, it is very difficult to form through-silicon vias (TSVs) in the silicon interposer 2250, and a cost required for manufacturing the silicon interposer 2250 is significantly high, and the silicon interposer 2250 is thus disadvantageous in increasing an area and reducing a cost.

Figure 5:
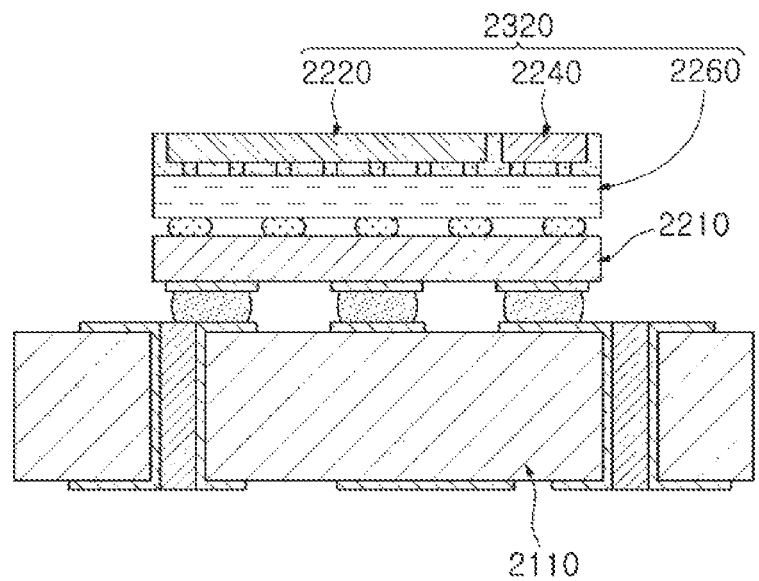
FIG. 5 is a schematic cross-sectional view illustrating a case in which a 2.5D organic interposer package is mounted on a mainboard.

FIG. 5 is a schematic cross-sectional view illustrating a case in which a 2.5D organic interposer package is mounted on a mainboard.

As a method for solving the problem described above, it may be considered to use an organic interposer 2260 instead of the silicon interposer 2250. For example, it may be considered to manufacture a semiconductor package 2320 including an organic interposer by 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other through the shortest path. In addition, when the semiconductor package 2310 including an organic interposer is again mounted and redistributed on a BGA substrate 2210, or the like, it may be ultimately mounted on a mainboard 2110. In addition, the organic interposer may be advantageous in increasing an area and reducing a cost.

The semiconductor package 2320 including an organic interposer may be manufactured by performing a package process of mounting chips 2220 and 2240 on the organic interposer 2260 and then molding or encapsulating the chips. Here, when a molding process is not performed, package handling is not conducted, such that the package may not be connected to the BGA substrate 2210, or the like. Therefore, rigidity of the package is maintained by the molding. However, when the molding process is performed, warpage of the package may occur, fillability of an underfill resin may be deteriorated, and a crack between a semiconductor chip and an encapsulant may occur, due to mismatch between coefficients of thermal expansion (CTEs) of the interposer 2260 and the encapsulant of the chips 2220 and 2240, as described above.

Figure 6:
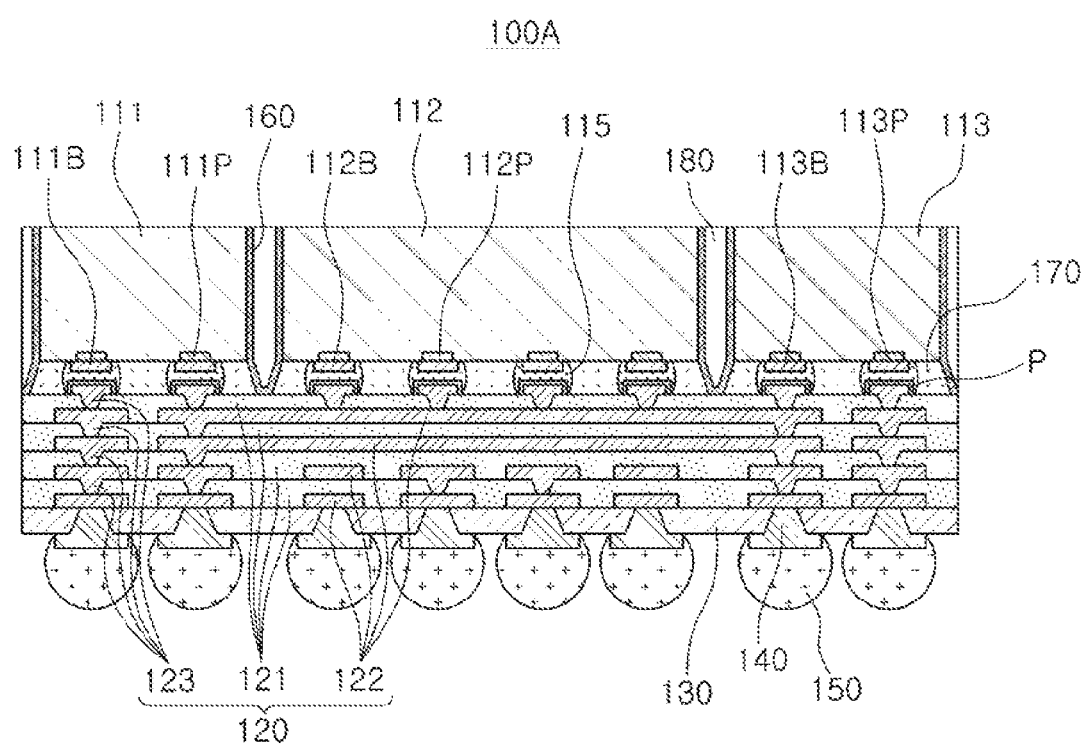
FIG. 6 is a schematic cross-sectional view illustrating an example of a semiconductor package including an organic interposer.

FIG. 6 is a schematic cross-sectional view illustrating an example of a semiconductor package including an organic interposer.

Referring to FIG. 6, a semiconductor package 100A including an organic interposer according to an exemplary embodiment in the present disclosure may include semiconductor chips 111, 112, and 113 having active surfaces having connection pads 111P, 112P, and 113P disposed thereon, respectively, the interposer 120 disposed on the active surfaces of the semiconductor chips 111, 112, and 113 and including a wiring layer 122 electrically connected to the respective connection pads 111P, 112P, and 113P, barrier layers 160 disposed on side surfaces of the semiconductor chips 111, 112, and 113, an underfill resin 170 fixing the semiconductor chips 111, 112, and 112 onto the interposer 120, and an encapsulant 180 encapsulating at least portions of the semiconductor chips 111, 112, and 113. The semiconductor package 100A including an organic interposer may further include a passivation layer 130 disposed on the other surface of the interposer 120, an underbump metal layer 140 formed in openings of the passivation layer 130 and electrically connected to the wiring layer 122 of the interposer 120, and electrical connection structures 150 disposed on the underbump metal layer 140 and electrically connected to the wiring layer 122 of the interposer 120 through the underbump metal layer 140.

The barrier layers 160, which are stress barrier layers, may be disposed between the semiconductor chips 111, 112, and 113, and the encapsulant 180. The barrier layers 160 may be formed of a material having a CTE greater than that of the semiconductor chips 111, 112, and 113 and smaller than that of the encapsulant 180. Therefore, the barrier layers 160 may alleviate a difference between the CTEs of the semiconductor chips 111, 112, and 113 and the encapsulant 180 to reduce stress, and prevent occurrence of defects such as warpage or a crack of a boundary. The barrier layers 160 may also be formed of a material that may improve adhesion between the semiconductor chips 111, 112, and 113 and the encapsulant 180. Also in this case, the barrier layers 160 may prevent occurrence of defects such as a crack of a boundary. In the semiconductor package 100A including an organic interposer according to the exemplary embodiment, the barrier layers 160 may extend along side surfaces of the underfill resin 170 between adjacent semiconductor chips 111, 112, and 113, and also extend onto the interposer 120. Therefore, the barrier layers 160 may be disposed in a form in which they are directly connected to each other between the adjacent semiconductor chips 111, 112, and 113. In addition, a material constituting the encapsulant 180 may be removed from upper surfaces of the semiconductor chips 111, 112, and 113 by grinding in order to secure heat dissipation characteristics, such that the upper surfaces of the semiconductor chips 111, 112, and 113 maybe externally exposed and the barrier layers 160 may also be exposed on the same level.

The respective components included in the semiconductor package 100A including an organic interposer according to the exemplary embodiment will hereinafter be described below in more detail.

The semiconductor chips 111, 112, and 113 may be an integrated circuit (IC) provided in an amount of several hundred to several million or more elements integrated in a single chip. In this case, a base material of a body of each of the semiconductor chips may be silicon (Si), germanium (Ge), gallium arsenide (GaAs), or the like. Various circuits may be formed on each of the bodies. The connection pads 111P, 112P, and 113P of the semiconductor chips 111, 112, and 113 may electrically connect the semiconductor chips 111, 112, and 113 to other components. A material of each of the connection pads 111P, 112P, and 113P may be a conductive material such as aluminum (Al), or the like. A passivation layer exposing the connection pads 111P, 112P, and 113P may be formed on each of the bodies, and may be an oxide film, a nitride film, or the like, or a double layer of an oxide layer and a nitride layer. An insulating layer, and the like, may also be further disposed in required positions. A redistribution layer may further be formed on the active surfaces of the semiconductor chips 111, 112, and 113, and low melting point metals 111B, 112B, and 113B, or the like, may also be connected to the connection pads 111P, 112P, and 113P, respectively. The low melting point metals 111B, 112B, and 113B may be metals having a melting point lower than that of the connection pads 111P, 112P, and 113P, for example, solders or alloys thereof. The semiconductor chips 111, 112, and 113 may be connected to an exposed upper wiring layer 122 of the interposer 120 through the connection pads 111P, 112P, and 113P and/or the low melting point metals 111B, 112B, and 113B, and connection members 115 such as solders, or the like, may be used to connect the semiconductor chips 111, 112, and 113 to the exposed upper wiring layer 122. The respective semiconductor chips 111, 112, and 113 may be fixed onto the interposer 120 by any known underfill resin 170.

A second semiconductor chip 112 may be an ASIC such as a GPU. First and third semiconductor chips 111 and 113 may be memories such as HBMs. That is, each of the semiconductor chips 111, 112, and 113 may be an expensive chip having several hundred of thousand or more inputs/outputs (I/Os), but is not limited thereto. For example, the first and third semiconductor chips 111 and 113, which are the HBMs, or the like, may be disposed side-by-side with the second semiconductor chip 112, which is the ASIC such as the GPU, or the like, at both sides of the second semiconductor chip 112, respectively.

The interposer 120 may redistribute the connection pads 111P, 112P, and 113P of the semiconductor chips 111, 112, and 113. Several tens to several hundreds of connection pads 111P, 112P, and 113P of each of the semiconductor chips 111, 112, and 113 having various functions may be redistributed by the interposer 120, and may be physically or electrically externally connected through the electrical connection structure 150 depending on the functions. The interposer 120 may include insulating layers 121, the wiring layers 122 formed on or in the insulating layers 121, and the vias 123 penetrating through the insulating layers 121 and electrically connecting the wiring layers 122 formed on different layers to each other. The number of layers of the interposer 120 may be more than that illustrated in the drawing or be less than that illustrated in the drawing. The interposer 120 having such a form may be used as a 2.5D type organic interposer.

For example, an insulating material may be used as a material of each of the insulating layers 121. In this case, a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a photosensitive insulating material such as a photoimagable dielectric (PID) resin may be used the insulating material. That is, each of the insulating layers 121 may be a photosensitive insulating layer. When the insulating layer 121 has photosensitive properties, the insulating layer 121 may be formed to have a smaller thickness, and a fine pitch of the via 123 may be achieved more easily. When the insulating layers 121 are multiple layers, materials of the insulating layers 121 may be the same as each other, and may also be different from each other. When the insulating layers 121 are the multiple layers, the insulating layers 121 may be integrated with each other depending on a process, such that a boundary therebetween may also not be apparent.

The wiring layers 122 may serve to substantially redistribute the connection pads 111P, 112P, and 113P. A material of each of the wiring layers 122 may be a conductive material such as copper (Cu), aluminum (Al), silver (Ag), tin (Sn), gold (Au), nickel (Ni), lead (Pb), titanium (Ti), or alloys thereof. The wiring layers 122 may perform various functions depending on designs of corresponding layers. For example, the wiring layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 122 may include via pads, connection terminal pads, and the like. A surface treatment layer P may be formed on a surface of the uppermost wiring layer 122 serving as pads for mounting the semiconductor chips 111, 112, and 113 among the wiring layers 122. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 123 may electrically connect the wiring layers 122, or the like, formed on different layers to each other, resulting in an electrical path in the semiconductor package 100A including an organic interposer. A material of each of the vias 123 may be a conductive material such as copper (Cu), aluminum (Al), silver (Ag), tin (Sn), gold (Au), nickel (Ni), lead (Pb), titanium (Ti), or alloys thereof. The vias 123 may be completely filled with a conductive material, but are not limited thereto. A cross-sectional shape of each of the vias 123 may be an approximately reverse trapezoidal shape in the drawing.

The passivation layer 130 may protect the interposer 120 from external physical or chemical damage. A material of the passivation layer 130 is not particularly limited. For example, an insulating material may be used as the material of the passivation layer 130. In this case, the insulating material may be the material described as the insulating material of the insulating layer 121 of the interposer 120 described above, for example, the ABF.

The underbump metal layer 140 may improve connection reliability of the electrical connection structures 150 to improve board level reliability of the semiconductor package 100A including an organic interposer. The underbump metal layer 140 may be formed in the openings of the passivation layer 130, and may be electrically connected to the wiring layer 122 of the interposer 120. The underbump metal layer 140 may be formed by any known metallization method. That is, the underbump metal layer 140 may include any known metal such as copper (Cu).

The electrical connection structure 150 may physically or electrically externally connect the semiconductor package 100A including an organic interposer. For example, the semiconductor package 100A including an organic interposer may be mounted on the mainboard of the electronic device through the electrical connection structures 150. Each of the electrical connection structures 150 may be formed of a conductive material, for example, a solder, or the like. However, this is only an example, and a material of each of the electrical connection structures 150 is not particularly limited thereto. Each of the electrical connection structures 150 may be a land, a ball, a pin, or the like. The electrical connection structures 150 may be formed as a multilayer or single layer structure. When the electrical connection structures 150 are formed as a multilayer structure, the electrical connection structures 150 may include a copper (Cu) pillar and a solder. When the electrical connection structures 150 are formed as a single layer structure, the electrical connection structures 150 may include a tin-silver solder or copper (Cu). However, this is only an example, and the electrical connection structures 150 are not limited thereto.

The number, an interval, a disposition form, and the like, of electrical connection structures 150 are not particularly limited, but may be sufficiently modified depending on design particulars by those skilled in the art. For example, the electrical connection structures 150 may be provided in an amount of several tens to several thousands according to the numbers of connection pads 111P, 112P, and 113P, or may be provided in an amount of several tens to several thousands or more or several tens to several thousands or less. Some of the electrical connection structures 150 may be disposed in a fan-out region. The fan-out region refers to a region except for a region in which the semiconductor chips 111, 112, and 113 are disposed. That is, the semiconductor package 100A including an organic interposer according to the exemplary embodiment may be a fan-out semiconductor device. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The barrier layers 160 may be disposed on the side surfaces of the semiconductor chips 111, 112, and 113, and be disposed between the semiconductor chips 111, 112, and 113 and the encapsulant 180. The semiconductor chips 111, 112, and 113 are not in direct contact with the encapsulant 180, but may be spaced apart from the encapsulant 180 by the barrier layers 160. The barrier layers 160 may extend along the side surfaces of the underfill resin 170, and may be disposed on the side surfaces of the underfill resin 170 to be inclined with respect to an upper surface of the interposer 120. The barrier layers 160 may be disposed in the form in which they are directly connected to each other between the adjacent semiconductor chips 111, 112, and 113, and be directly connected to each other on the upper surface of the interposer 120, but are not limited thereto. In addition, the upper surfaces of the semiconductor chips 111, 112, and 113 may be externally exposed in order to secure the heat dissipation characteristics, and the barrier layers 160 may also be exposed on the same level. Upper surfaces of the barrier layers 160 may be disposed on the same level as that of the upper surfaces of the semiconductor chips 111, 112, and 113. A thickness of the barrier layers 160 is not limited to that illustrated in the drawing.

The barrier layers 160 may be formed of a material that may reduce mismatch between the CTE of the semiconductor chips 111, 112, and 113 and the CTE of the encapsulant 180. The barrier layers 160 may be formed of the material having the CTE greater than that of the semiconductor chips 111, 112, and 113 and smaller than that of the encapsulant 180. For example, the CTE of the material constituting the barrier layers 160 may be in a range of 3 ppm/K to 30 ppm/K. The barrier layers 160 may be formed of an insulating material, for example, the same material as that of the insulating layer 121 or the passivation layer 130, but are not limited thereto.

The underfill resin 170 may fix the semiconductor chips 111, 112, and 113 onto the interposer 120. Any known material including epoxy, or the like, may be used as a material of the underfill resin 170. The underfill resin 170 may be omitted. Although not illustrated in the drawings, passive components may also be disposed and packaged side-by-side with the semiconductor chips 111, 112, and 113 on the interposer 120.

The encapsulant 180 may protect the semiconductor chips 111, 112, and 113, and the like. An encapsulation form of the encapsulant 180 is not particularly limited, but may be a form in which the encapsulant 180 surrounds at least portions of the semiconductor chips 111, 112, and 113. A material of the encapsulant 180 is not particularly limited. For example, an insulating material may be used as the material of the encapsulant 180. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. However, the material of the encapsulant 180 is not limited thereto, but may also be prepreg, or the like, including a glass fiber. Alternatively, any known epoxy molding compound (EMC), or the like, may also be used as the material of the encapsulant 180.

FIGS. 7A through 7D are schematic views illustrating an example of processes of forming the semiconductor package including an organic interposer of FIG. 6.

Figure 7A:
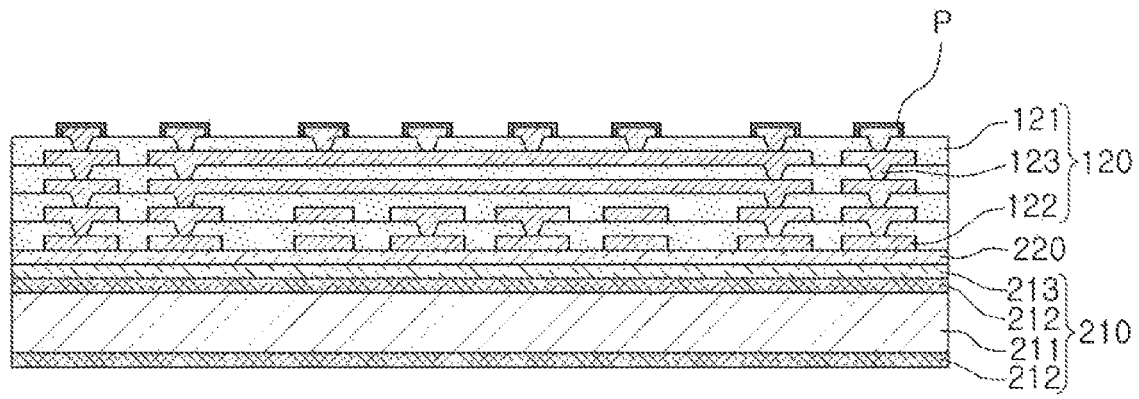
FIGS. 7A through 7D are schematic views illustrating an example of processes of forming the semiconductor package including an organic interposer of FIG. 6.

Referring to FIG. 7A, a carrier 210 may be prepared, and the interposer 120 may be formed on the carrier 210.

The carrier 210 may include a core layer 211 and metal layers 212 and 213 formed on the core layer 211. The core layer 211 may be formed of, for example, prepreg including an insulating resin, an inorganic filler, and a glass fiber. The metal layers 212 and 213 may include a metal such as copper (Cu), titanium (Ti), or the like. Surface treatment may be performed between the metal layers 212 and 213 so that the metal layers 212 and 213 are easily separated from each other. Alternatively, a release layer may be provided between the metal layers 212 and 213. The carrier 210 may be a general detach core. The resin layer 220 may also be formed on the carrier 210. The resin layer 220 may serve to electrically insulate between the carrier 210 and the manufactured semiconductor package 100A including an organic interposer. That is, the resin layer 220 may be used for the purpose of the insulation between the manufactured semiconductor package 100A including an organic interposer and the carrier 210 when an electrical test is performed on the wiring layers 122 of the interposer 120. The resin layer 220 maybe formed by laminating a film form or applying and hardening a liquid phase form. The resin layer 220 may also be omitted.

The interposer 120 maybe formed by forming a seed layer on the resin layer 220, forming patterns using a dry film, or the like, filling the patterns by a plating process to form the wiring layer 122, laminating or applying a PID, or the like, on or to the wiring layer 122 to form the insulating layer 121, forming via holes in the insulating layer 121, and filling the via holes by a plating process, or the like, to form the vias 123. The plating process may be a subtractive process, an additive process, a semi-additive process (SAP), a modified semi-additive process (MSAP), or the like, but is not limited thereto.

Then, the surface treatment layer P, or the like, may be formed on the uppermost wiring layer 122. In addition, a quad route test, an electrical test of the wiring layer 122, and the like, may be performed.

Figure 7B:
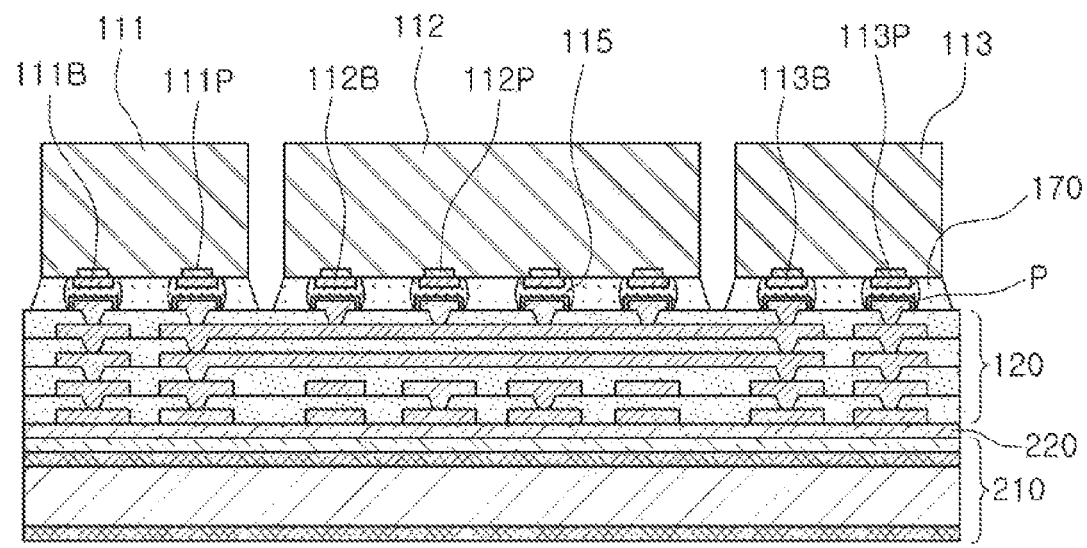

Referring to FIG. 7B, the semiconductor chips 111, 112, and 113 may be mounted on the interposer 120. The connection members 115 such as the solders, or the like, may be used to mount the semiconductor chips 111, 112, and 113 on the interposer 120. Then, the semiconductor chips 111, 112, and 113 may be fixed by the underfill resin 170.

Figure 7C:
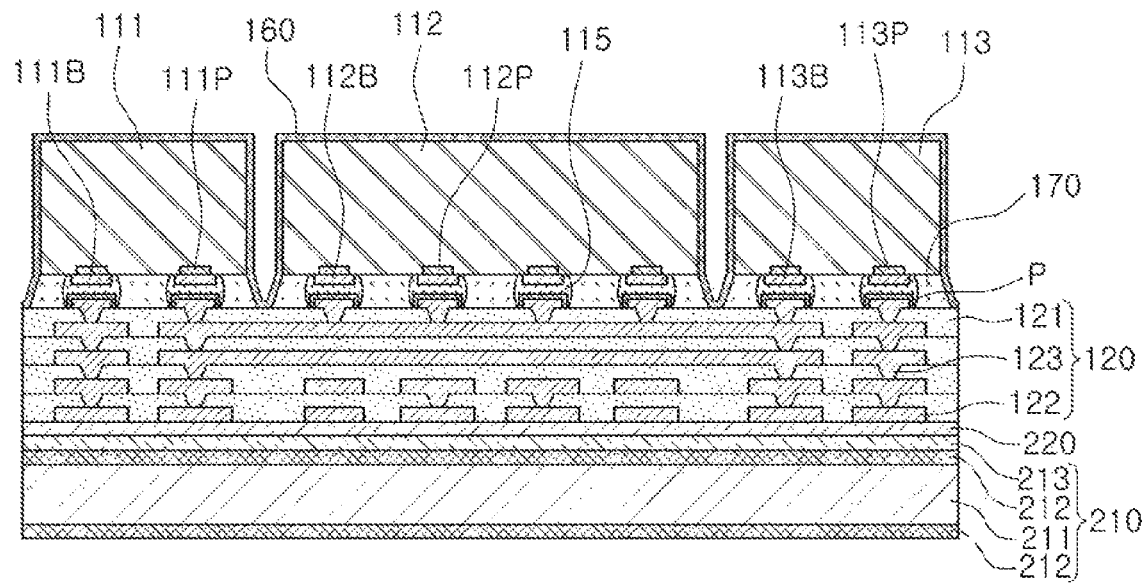

Referring to FIG. 7C, the barrier layers 160 covering the semiconductor chip 111, 112, and 113 may be formed. The barrier layers 160 may be formed by a process such as chemical vapor deposition (CVD), sputtering, coating, or the like. The barrier layers 160 may cover the side surfaces and the upper surfaces of the semiconductor chips 111, 112, and 113, and extend to the side surfaces of the underfill resin 170 to be connected to each other between the adjacent semiconductor chips 111, 112, and 113. The barrier layers 160 maybe in contact with the upper surface of the interposer 120 between the adjacent semiconductor chips 111, 112, and 113, but are not limited thereto.

Figure 7D:
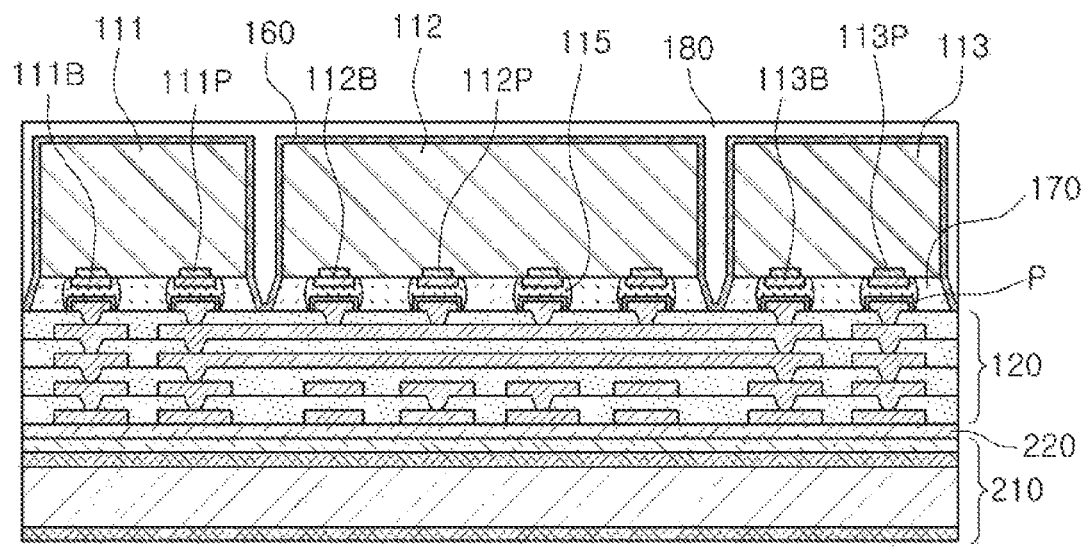

Referring to FIG. 7D, the encapsulant 180 encapsulating the semiconductor chips 111, 112, and 113 may be formed on the interposer 120. The encapsulant 180 maybe formed by laminating a film form or applying or hardening a liquid phase form.

Then, referring to FIG. 7D together with FIG. 6, the encapsulant 180 may be grinded. The upper surfaces of the semiconductor chips 111, 112, and 113 may be disposed on the same level by the grinding. That is, thicknesses of the semiconductor chips 111, 112, and 113 may become substantially the same as each other. In addition, the upper surfaces of the semiconductor chips 111, 112, and 113 and the upper surface of the barrier layer 160 may be externally exposed.

Then, the carrier 210 may be separated. The carrier 210 maybe separated by separating the metal layers 212 and 213 from each other. In this case, the metal layer 213 may be removed by an etching process. After the carrier 210 is separated, the resin layer 220 may be removed by grinding, or the like. However, when the resin layer 220 is omitted, the grinding may also be omitted. Then, the openings may be formed in the passivation layer 130 by laser drilling. After the openings are formed, a desmear process, a process of forming the underbump metal layer 140, a process of attaching the electrical connection structures 150, and a reflow process may be performed. The semiconductor package 100A including an organic interposer according to the exemplary embodiment described above may be manufactured through a series of processes.

Figure 8:
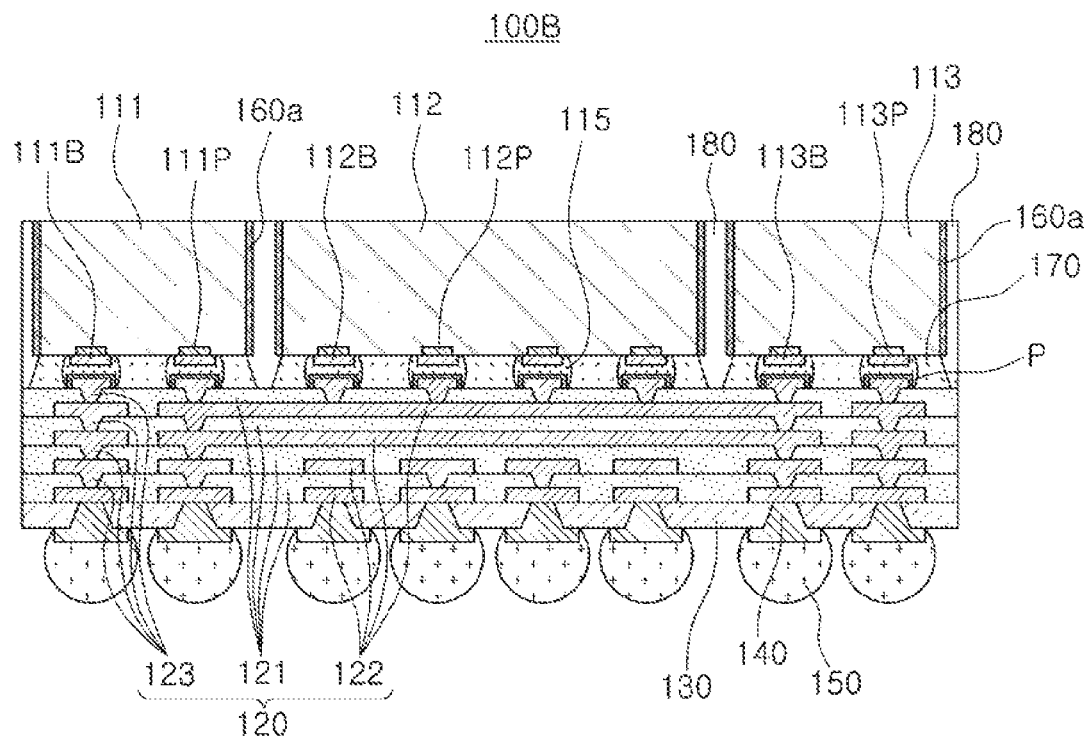
FIG. 8 is a schematic cross-sectional view illustrating another example of a semiconductor package including an organic interposer.

FIG. 8 is a schematic cross-sectional view illustrating another example of a semiconductor package including an organic interposer.

Referring to FIG. 8, in a semiconductor package 100B including an organic interposer according to another exemplary embodiment in the present disclosure, barrier layers 160a may be disposed on only side surfaces of semiconductor chips 111, 112, and 113. That is, the barrier layers 160a do not extend to side surfaces of an underfill resin 170. Therefore, lower surfaces of the barrier layers 160a may be disposed on the same level as that of lower surfaces of the semiconductor chips 111, 112, and 113. In addition, the barrier layers 160a may be formed of a conductive material as well as an insulating material. The barrier layers 160a may be manufactured by forming the barrier layers 160a on upper surfaces and the side surfaces of the semiconductor chips 111, 112, and 113 before mounting the semiconductor chips 111, 112, and 113 and then mounting the semiconductor chips 111, 112, and 113, in the process described above with reference to FIG. 7B.

Other configurations, for example, contents described with reference to FIGS. 6 through 7D may be applied to the semiconductor package 100B including an organic interposer according to another exemplary embodiment, and a detailed description thereof overlaps that described above, and is thus omitted.

Figure 9:
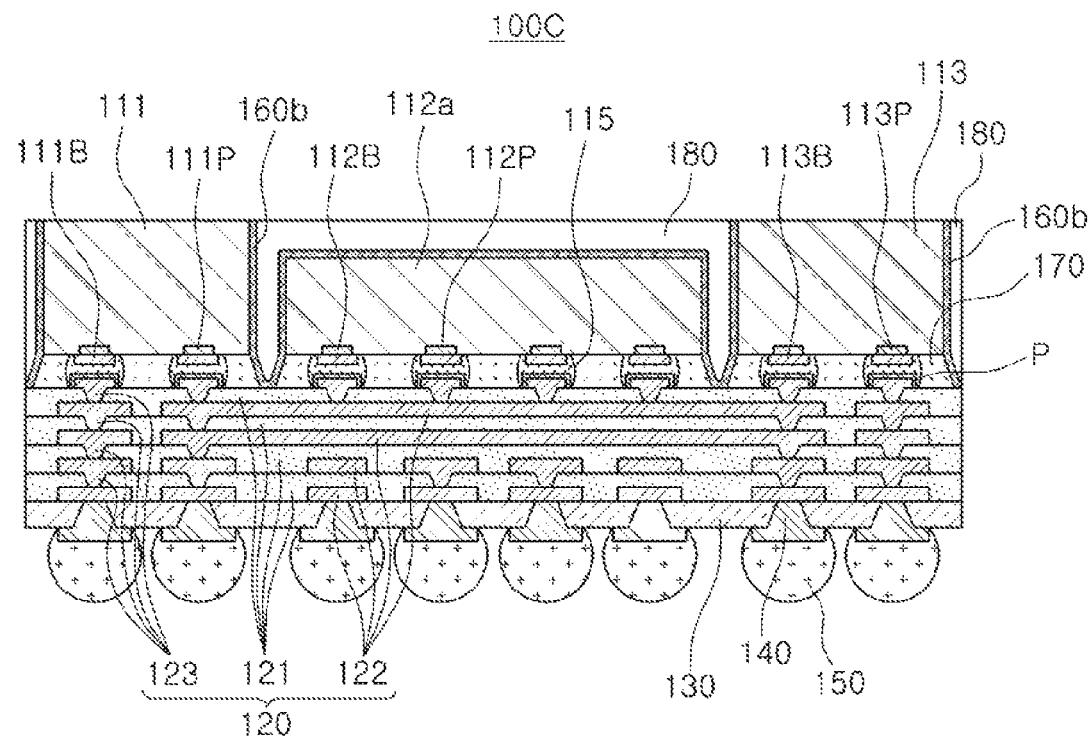
FIG. 9 is a schematic cross-sectional view illustrating another example of a semiconductor package including an organic interposer.

FIG. 9 is a schematic cross-sectional view illustrating another example of a semiconductor package including an organic interposer.

Referring to FIG. 9, in a semiconductor package 100C including an organic interposer according to another exemplary embodiment in the present disclosure, thicknesses of semiconductor chips 111, 112a, and 113 may be different from each other. As illustrated in FIG. 9, a thickness of the second semiconductor chip 112a may be smaller than that of the first and third semiconductor chips 111 and 113, and an upper surface of the second semiconductor chip 112a may thus be encapsulated by an encapsulant 180. In addition, barrier layers 160b may cover side surfaces of the first and third semiconductor chips 111 and 113 and side surfaces and an upper surface of the second semiconductor chip 112a. That is, upper surfaces of the first and third semiconductor chips 111 and 113 may be externally exposed, while the upper surface of the second semiconductor chip 112a may be covered by the barrier layer 160b and the encapsulant 180. When the thicknesses of the semiconductor chips 111, 112a, and 113 are different from each other as described above, the barrier layer 160b may further be disposed on the upper surface of the second semiconductor chip 112a having the smaller thickness. Therefore, mismatch between CTEs may be alleviated as compared to a case in which upper surface of the second semiconductor chip 112a is covered by only the encapsulant 180, such that warpage characteristics may further be improved.

Other configurations, for example, contents described with reference to FIGS. 6 through 7D may be applied to the semiconductor package 100C including an organic interposer according to another exemplary embodiment, and a detailed description thereof overlaps that described above, and is thus omitted.

As set forth above, according to the exemplary embodiments in the present disclosure, a semiconductor package including an organic interposer capable of having improved reliability by forming a stress barrier layer between an encapsulant and a semiconductor chip may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
    a first semiconductor chip and a second semiconductor chip each having active surfaces on which connection pads are disposed;
    an organic interposer disposed on the active surfaces of the first semiconductor chip and the second semiconductor chip and including a wiring layer electrically connected to the connection pads;
    an underfill resin disposed between the first semiconductor chip and the organic interposer and between the second semiconductor chip and the organic interposer;
    barrier layers disposed on outer side surfaces of the first semiconductor chip and the second semiconductor chip, the barrier layers comprising a first barrier layer disposed between a side surface of the first semiconductor chip and a side surface of the second semiconductor chip; and
    an encapsulant encapsulating at least portions of the first semiconductor chip and the second semiconductor chip.

2. The semiconductor package of claim 1, wherein the barrier layers are formed of a material having a coefficient of thermal expansion (CTE) higher than a CTE of the first semiconductor chip and a CTE of the second semiconductor chip and lower than a CTE of the encapsulant.

3. The semiconductor package of claim 1, wherein the barrier layers are directly connected to each other between the first semiconductor chip and the second semiconductor chip by the first barrier layer.

4. The semiconductor package of claim 3, wherein the barrier layers are directly connected to each other on the organic interposer.

5. The semiconductor package of claim 1, wherein the barrier layers extend to side surfaces of the underfill resin.

6. The semiconductor package of claim 1, wherein upper surfaces of the barrier layers are exposed externally of the encapsulant.

7. The semiconductor package of claim 6, wherein the upper surfaces of the barrier layers are disposed on the same level as a level of upper surfaces of the first semiconductor chip and the second semiconductor chip.

8. The semiconductor package of claim 1, wherein lower surfaces of the barrier layers are disposed on the same level as a level of lower surfaces of the first semiconductor chip and the second semiconductor chip.

9. The semiconductor package of claim 1, wherein the second semiconductor chip has a thickness lower than a thickness of the first semiconductor chip, and the first barrier layer covers an upper surface of the second semiconductor chip.

10. The semiconductor package of claim 9, wherein an upper surface of the first semiconductor chip is exposed externally of the encapsulant.

11. The semiconductor package of claim 1, wherein the barrier layers are formed of an insulating material.

12. The semiconductor package of claim 1, wherein the first semiconductor chip includes an application specific integrated circuit (ASIC), and
    the second semiconductor chip includes a memory.

13. The semiconductor package of claim 1, wherein the first semiconductor chip includes a graphics processing unit (GPU), and
    the second semiconductor chip includes a plurality of high bandwidth memories (HBMs).

14. The semiconductor package of claim 1, wherein the first semiconductor chip and the second semiconductor chip are electrically connected to each other through the organic interposer.

15. The semiconductor package of claim 1, wherein the barrier layers are formed of a material that improves adhesion between the first semiconductor chip and the second semiconductor chip and the encapsulant.

16. A semiconductor package, comprising:
    a semiconductor chip having an active surface on which connection pads are disposed thereon;
    an organic interposer disposed on the active surface of the semiconductor chip and including a wiring layer electrically connected to the connection pads;
    an underfill resin disposed between the semiconductor chip and the organic interposer;
    an encapsulant encapsulating at least portions of the semiconductor chip; and
    a barrier layer disposed between the semiconductor chip and the encapsulant, the barrier layer being disposed between an outer side surface of semiconductor chip and an outer side surface of an adjacent semiconductor chip.

17. The semiconductor package of claim 16, wherein the semiconductor chip is spaced apart from the encapsulant by the barrier layer so as not to be in direct contact with the encapsulant.

18. The semiconductor package of claim 1, wherein the barrier layers are disposed between the underfill resin and the encapsulant, between the first semiconductor chip and the encapsulant, and between the second semiconductor chip and the encapsulant.

* * * * *